United States Patent
Yau

(10) Patent No.: US 7,446,688 B1
(45) Date of Patent: Nov. 4, 2008

(54) SEQUENCE GENERATION FOR MISMATCH-SHAPING CIRCUITS

(75) Inventor: Samuel Chi Hong Yau, San Jose, CA (US)

(73) Assignee: Windond Electronics Corporation, Hsinchu (TW)

( * ) Notice: Subject to any disclaimer, the term of this patent is extended or adjusted under 35 U.S.C. 154(b) by 0 days.

(21) Appl. No.: 11/801,490

(22) Filed: May 9, 2007

(51) Int. Cl.
*H03M 1/66* (2006.01)

(52) U.S. Cl. .................. 341/144; 341/143; 341/118; 341/147; 341/148

(58) Field of Classification Search .......... 341/143, 341/144, 147, 148
See application file for complete search history.

(56) References Cited

U.S. PATENT DOCUMENTS

| | | | | |
|---|---|---|---|---|
| 5,404,142 | A * | 4/1995 | Adams et al. | 341/144 |
| 5,684,482 | A * | 11/1997 | Galton | 341/144 |
| 6,304,608 | B1 | 10/2001 | Chen et al. | 375/252 |
| 6,628,218 | B2 * | 9/2003 | Brooks et al. | 341/143 |
| 6,697,004 | B1 * | 2/2004 | Galton et al. | 341/144 |
| 6,771,199 | B2 * | 8/2004 | Brooks et al. | 341/143 |
| 6,816,097 | B2 * | 11/2004 | Brooks et al. | 341/143 |
| 6,867,721 | B1 * | 3/2005 | Lin | 341/144 |
| 7,193,548 | B2 * | 3/2007 | Kaplan | 341/144 |
| 7,304,593 | B2 * | 12/2007 | Luecking et al. | 341/143 |
| 7,308,032 | B2 * | 12/2007 | Capofreddi | 375/247 |
| 2003/0085827 | A1 * | 5/2003 | Koifman et al. | 341/144 |
| 2005/0134492 | A1 * | 6/2005 | Wang et al. | 341/143 |

OTHER PUBLICATIONS

Galton, Ian, "Spectral Shaping of Circuit Errors in Digital-to-Analog Converters", IEEE Trans. on Circuits and Systems—II, vol. 44, No. 10, pp. 808-817 Oct. 1997.

Welz, Jared, et al., "Necessary and Sufficient Conditions for Mismatch Shaping in a General Class of Multibit DACs", IEEE Trans. on Circuits and Systems—II, vol. 49, No. 12, pp. 748-759, Dec. 2002.

Welz, Jared, et al., "Simplified Logic for First-Order and Second-Order Mismatch-Shaping digital-to-Analog Converters", IEEE Trans. on Circuits and Systems—II, vol. 48, No. 11, pp. 1014-1027, Nov. 2001.

Yasuda, Akira, et al., "A Third-Order Delta-Sigma Modulator Using Second-Order Noise Shaping Dynamic Element Matching", IEEE J. of Solid State Circuits, vol. 33, No. 12, pp. 1879-1886, Dec. 1998.

* cited by examiner

*Primary Examiner*—Linh V Nguyen
(74) *Attorney, Agent, or Firm*—Blakely Sokoloff Taylor & Zafman LLP

(57) ABSTRACT

An embodiment of the present invention is a technique to design a DAC. A double-summed-to-zero (DSTZ) graph is created having a plurality of nodes linked by a plurality of directed branches. The DSTZ graph represents a finite state machine (FSM) that generates a sequence for a switching block used in a mismatch-shaping digital-to-analog converter (DAC). Each of the plurality of nodes represents a state in the FSM. The DSTZ graph has a total work function and a total potential energy summing to zero for a cycle traversal. A switching sequence is generated starting from a reference node in the plurality of nodes in response to an input sequence. The reference node has a zero potential energy.

21 Claims, 4 Drawing Sheets

SEQUENCE GENERATION FOR MISMATCH-SHAPING CIRCUITS

BACKGROUND

1. Field of the Invention

Embodiments of the invention relate to the field of circuits, and more specifically, to mismatch-shaping circuits.

2. Description of Related Art

A digital-to-analog converter (DAC) is usually implemented by an array of unit elements. Each unit element contributes to the output analog signal when selected. If all unit elements are identical to provide an exact amount of contribution (e.g., same weights) when selected, the DAC may be perfectly linear. In reality, circuit elements can never be made identical. Any mismatch may result in both noises and non-linearity.

Existing techniques to implement mismatch-shaping circuits have a number of drawbacks. One technique uses a quantizer and a limiter in the generator for generating $2^{nd}$ order sequences. Another technique uses a 3-state accumulator and an M-state accumulator. These techniques are typically expensive, requiring hardware components such as a quantizer, a limiter, or an accumulator.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to design a DAC. A double-summed-to-zero (DSTZ) graph is created having a plurality of nodes linked by a plurality of directed branches. The DSTZ graph represents a finite state machine (FSM) that generates a sequence for switching blocks used in a mismatch-shaping digital-to-analog converter (DAC). Each of the plurality of nodes represents a state in the FSM. The DSTZ graph has a total work function and a total potential energy summing to zero for a cycle traversal. A switching sequence is generated starting from a reference node in the plurality of nodes in response to an input sequence. The reference node has a zero potential energy.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to generate a switching sequence for tree-structured second order mismatch-shaping digital-to-analog converters (DACs). A double-summed-to-zero (DSTZ) graph is created to have a number of properties that satisfies the number conservation rule. The DSTZ graph is a state diagram that represents a finite-state machine (FSM). It may be used to generate a second order shaped sequence (SOSS). The SOSS is used by the switching blocks in a DAC.

Figure 1:
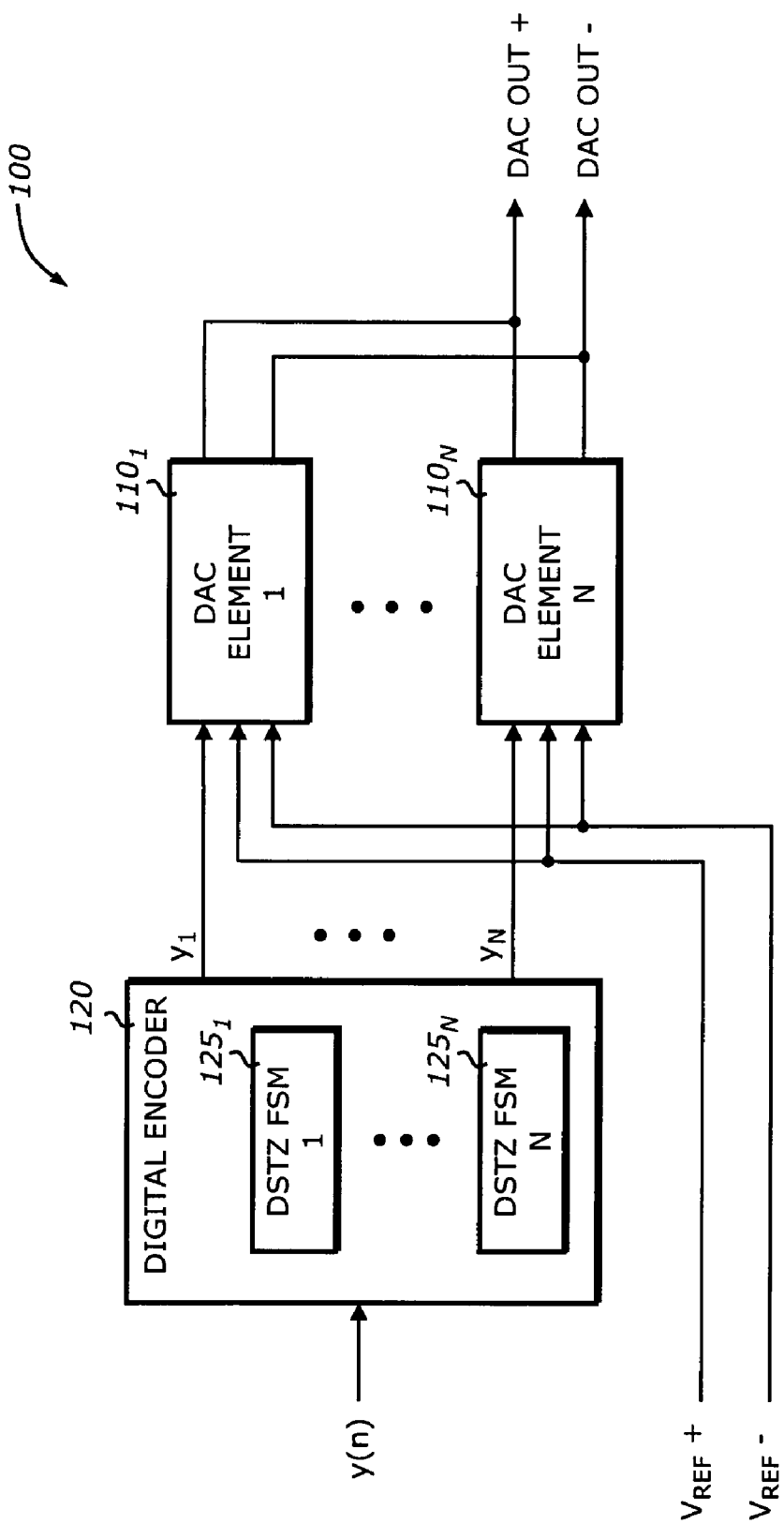
FIG. 1 is a diagram illustrating a digital-to-analog converter (DAC) in which one embodiment of the invention may be practiced.

FIG. 1 is a diagram illustrating a digital-to-analog converter (DAC) 100 in which one embodiment of the invention may be practiced. The DAC 100 represents a multi-bit tree-structured mismatch-shaping DAC. It has digital logic circuit to scramble the DAC capacitor or current-source connections so that the error introduced by the device mismatches, referred to as DAC noise, may be suppressed within the data converter's signal band. The DAC 100 includes N DAC elements $110_1$ to $110_N$ and a digital encoder 120.

Each of the N DAC elements $110_1$ to $110_N$ may be a one-bit DAC whose analog output is a charge packet applied to the summing node of an integrator. Reference voltages VREF+ and VREF− are applied to the N DAC elements $110_1$ to $110_N$ to charge charging components (e.g., capacitor) in each of the DAC elements. Each of the N DAC elements $110_1$ to $110_N$ receives a select input yj[n] (i=1, . . . , N) from the digital encoder 120. The DAC elements $110_1$ to $110_N$ are selected high or low according to whether the corresponding select inputs $y_i[n]$'s are high or low, respectively.

The digital encoder 120 encodes the sequence y[n] into N select inputs $y_1[n]$ to $y_N[n]$ to the N DAC elements $110_1$ to $110_N$. Assuming each of the select inputs represents numerically as one to select high and zero to select low, the digital encoder 120 ensures that $y[n]=y_1[n]+y_2[n]+\ldots+y_N[n]$.

The digital encoder 120 includes N double-summed-to-zero (DSTZ) finite state machines (FSMs) $125_i$ (i=1, . . . , N) to generate N switching sequences used to generate the N select inputs $y_1[n]$ to $y_N[n]$. Each of the DSTZ FSMs $125_i$'s provides an efficient and economical second order shaped sequence generator. The FSM $125_i$ may be implemented from a DSTZ graph or state diagram.

Figure 2:
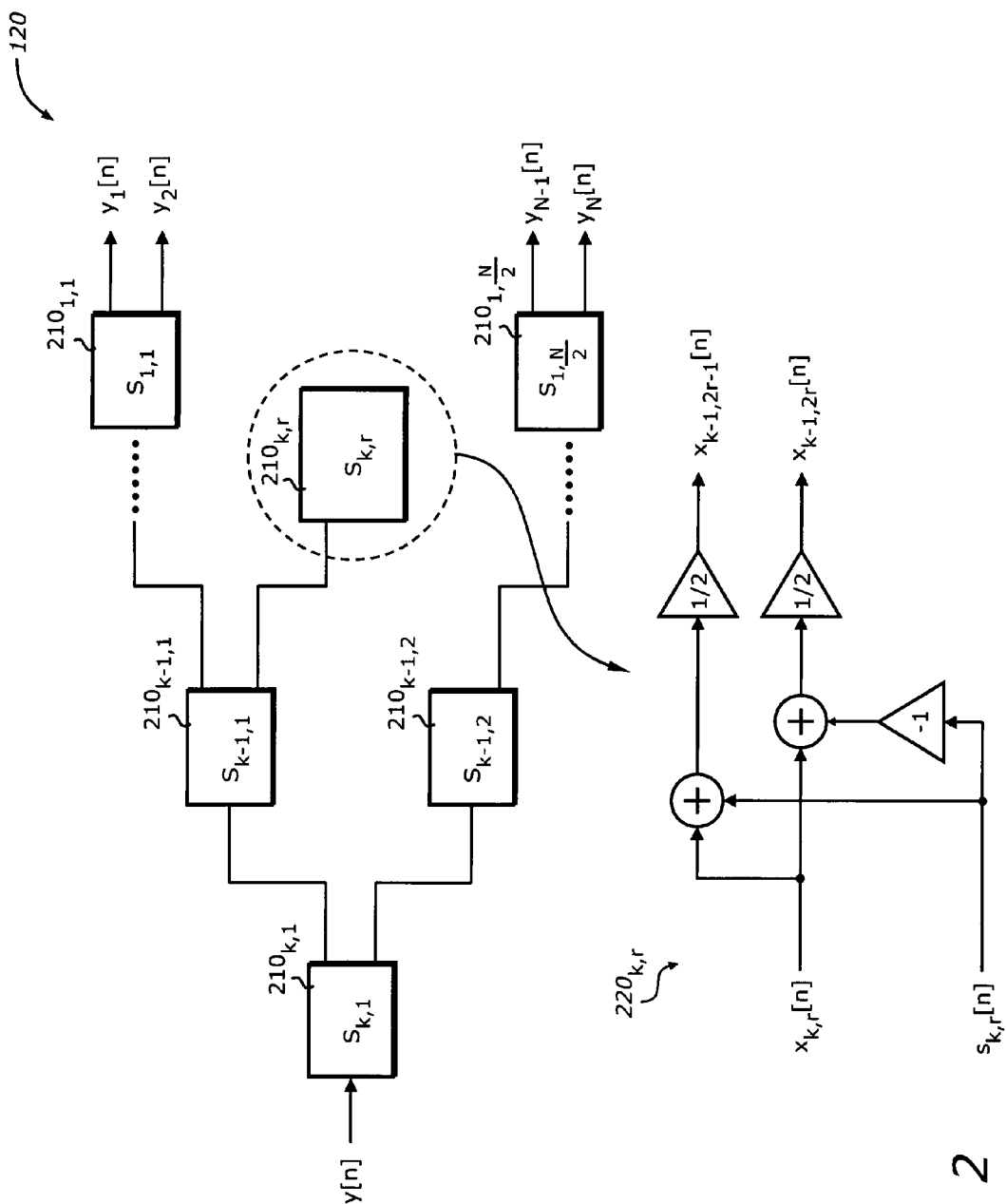
FIG. 2 is a diagram illustrating a digital encoder using double-summed-to-zero (DSTZ) finite state machine (FSM) according to one embodiment of the invention.

FIG. 2 is a diagram illustrating the digital encoder 120 using a DSTZ finite state machine (FSM) according to one embodiment of the invention. The digital encoder 120 includes (N−1) switching blocks $210_{k,r}$ $S_{k,r}$'S where $k=\log_2 N, \ldots, 1$ and $r=1, \ldots, N/(2^k)$. The (N−1) switching blocks $S_{k,r}$'s are arranged in a binary tree structure. The indices k and r represent the switching block's layer number, or tree level, and the position within the layer.

Each of the switching blocks $210_{k,r}$'s has a single input, denoted as $x_{k,r}[n]$, and two outputs, denoted as $X_{k-1,2r-1}[n]$ and $X_{k-1,2r}[n]$ corresponding to the top and bottom outputs, respectively. The switching sequence $s_{k,r}[n]$ is defined as the difference between the top and the bottom output sequences of the switching block $S_{k,r}$ $210_{k,r}$:

$$s_{k,r}[n]=x_{k-1,2r-1}[n]-x_{k-1,2r}[n] \tag{1}$$

For an implementation of the switching block, the equations of the outputs may be defined as:

$$x_{k-1,2r-1}[n]=(\tfrac{1}{2})*(x_{k,r}[n]+s_{k,r}[n]) \tag{2a}$$

$$x_{k-1,2r}[n]=(\tfrac{1}{2})*(x_{k,r}[n]-s_{k,r}[n]) \tag{2b}$$

The switching sequence is generated within the switching block to obtain the desired spectral properties of the DAC noise. It is known that the switching sequence is constrained to satisfy restrictions inherent to the digital encoder 120. These restrictions include two conditions: (1) each of the outputs of the digital encoder 120 $y_i[n]$, where i=1, ..., N, is limited to the set $\{0,1\}$; and (2) the sum of the outputs is equal to the DAC input, i.e., $y[n]=y_i[n]+ \ldots +y_N[n]$. These conditions are met if each of the switching blocks $210_{k,r}$'s satisfies two conditions in the number conservation rule. The two conditions in the number conservation rule are: (1) the two outputs of each switching block are in the range $\{0, 1, \ldots, 2^{(k-1)}\}$ where k is the layer number or the tree level; and (2) the sum of the two outputs is equal to the input to the switching block, i.e., $x_{k-1,2r-1}[n]+x_{k-1,2r}[n]=x_{k,r}[n]$.

The two conditions of the number conservation rule may be re-written as the following:

$$s_{k,r}[n] = \begin{cases} \text{even} & \text{if } x_{k,r}[n] \text{ is even} \\ \text{odd} & \text{if } x_{k,r}[n] \text{ is odd} \end{cases} \quad (3a)$$

$$|s_{k,r}[n]| \leq \min\{x_{k,r}[n], 2^k - x_{k,r}[n]\} \quad (3b)$$

If all the switching sequences $s_{k,r}[n]$ are $L^{th}$ order shaped (i.e., with power spectrum proportional to $(1-z^{-1})^L$), then the DAC noise is also $L^{th}$ order shaped. The problem then becomes to find an $L^{th}$ order shaped sequence that satisfies both conditions (3a) and (3b).

Figure 3:
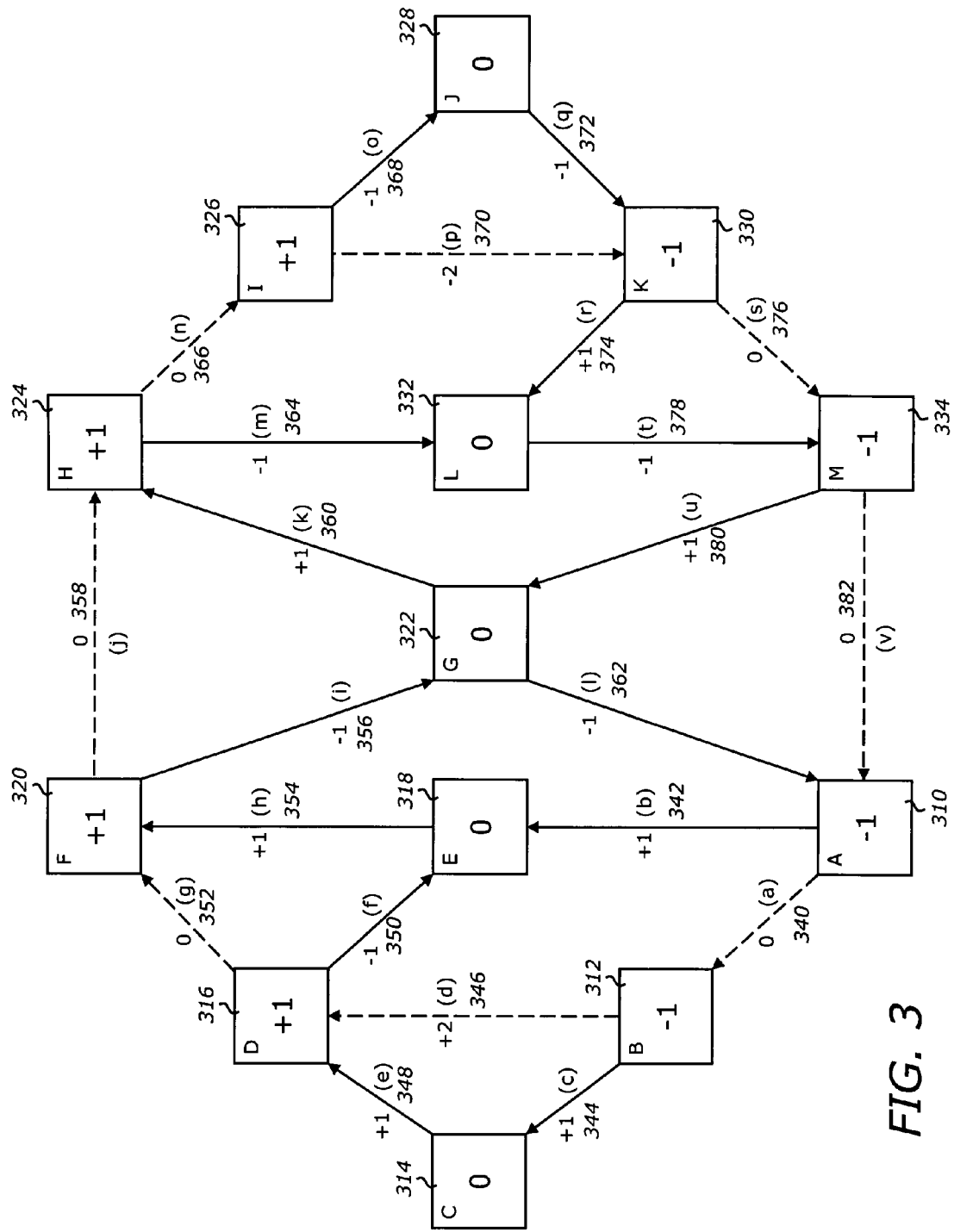
FIG. 3 is a diagram illustrating a (DSTZ) graph according to one embodiment of the invention.

FIG. 3 is a diagram illustrating a DSTZ graph 300 according to one embodiment of the invention. The DSTZ graph 300 is a state diagram that is created to have a plurality of nodes linked by a plurality of directed branches. The DSTZ graph 300 represents a finite state machine (FSM) that generates a switching sequence for a switching block used in the mismatch-shaping DAC 100 (FIG. 1). Each of the plurality of nodes represents a state in the FSM.

The DSTZ graph is created to have the following characteristics:

Potential energy: Each node has an integer potential energy associated with it. Each node represents a state in the FSM. When the FSM is realized in digital circuits, specifically with flip-flops and combinational logic. There exists at least one node with a zero potential energy, which is marked as a reference node. Any node with a zero potential energy may be used as the reference node. The potential energy is the sum of an entire switching sequence up to a time instant t, assuming the switching sequence starts from a reference node with zero potential energy.

Work function: Each directed branch has a work function associated with it. Each branch represents a transition that the FSM changes from one state to another. A directed branch starts from an originating, or source, node and ends at a terminating, or destination, node. The work function represents a rule that governs how the FSM changes from one state to another. Each branch has a condition or an event trigger that, once satisfied, will trigger the transition that allows the FSM to transition to another state or to the current state. The work function is equal to the potential energy of the terminating node minus the potential energy of the originating node. Since the potential energy of a node is an integer, it follows that any work function is also an integer. A branch with an associated work function equal to an odd integer is called an odd branch. A branch with an associated work function equal to an even integer, including zero, is called an even branch.

Node branching: For any node with non-zero potential energy, there are at least 2 branches originating from that node, one of which is an odd branch, and the other is an even branch. For any node with a zero potential energy, there is at least one odd branch originating from that node.

Node cycle traversal: For any traversal, of any length, of the graph originating from and terminating at the same node, hereafter referred to as a node cycle traversal, the work functions of all the branches it has traversed sums to zero, counting as many times as a branch is traversed. The sum of the work functions of all the branches it has traversed is referred to as a total work function for that that cycle traversal.

Branch cycle traversal: For any traversal, of any length, of the graph originating from and terminating at the same branch, hereafter referred to as a branch cycle traversal, the potential energies of all the nodes it has traversed sum to zero, counting as many times as a node is traversed. The sum of the potential energies of all the nodes it has traversed is referred to as a total potential energy for that cycle traversal.

The DSTZ graph shown in FIG. 3 is an illustrative example. The potential energy is labeled inside of each node and the work function is labeled along each branch. The DSTZ graph 300 includes 13 nodes, or states, and 22 branches. The nodes are: node A 310, node B 312, node C 314, node D 316, node E 318, node F 320, node G 322, node H 324, node I 326, node J 328, node K 330, node L 332, and node M 334. The branches are: branch (a) 340, branch (b) 342, branch (c) 344, branch (d) 346, branch (e) 348, branch (f) 350, branch (g) 352, branch (h) 354, branch (i) 356, branch (j) 358, branch (k) 360, branch (l) 362, branch (m) 364, branch (n) 366, branch (o) 368, branch (p) 370, branch (q) 372, branch (r) 374, branch (s) 376, branch (t) 378, branch (u) 380, and branch (v) 382.

The potential energies for the nodes A 310, node B 312, node C 314, node D 316, node E 318, node F 320, node G 322, node H 324, node I 326, node J 328, node K 330, node L 332, and node M 334 are: −1, −1, 0, +1, 0, +1, 0, +1, +1, 0, −1, 0, and −1, respectively.

The work functions for the branches are as shown in the figure. For example, the work functions for branches (a), (b), (c) and (d) are 0, +1, +1, +2. Note that the work functions are determined according to the rule work functions as above. For example, branch (m) 364 connects node H 324 and L 332. The work function of branch (m) 364 is equal to the potential energy of the terminating node L 332, which is 0, minus the potential energy of the originating node H 324, which is +1. The work function of branch (m) 364 is therefore equal to 0−1=−1.

The DSTZ graph 300 satisfies all the characteristics mentioned above. It satisfies the node cycle traversal. As an illustration, suppose a node cycle traversal traverses from nodes M and back to node M in the following sequence: M→G→H→L→M→G→H→I→J→K→M. The branches it has traversed are respectively, (u), (k), (m), (t), (u), (k), (n), (o), (q), (s). The total work function or the sum of work functions for this node cycle traversal is 1+1−1−1+1+1+0−1−1+0=0, which satisfies the node cycle traversal condition.

As another illustration for the branch cycle traversal, suppose a branch cycle traversal traverses from branch (f) and back to branch (f) in the following sequence: (f)→(h)→(i)→(l)→(a)→(c)→(e)→(g)→(i)→(l)→(a)→(d)→(f). The nodes it has traversed are respectively, E, F, G, A, B, C, D, F, G, A, B, D. The total potential energy or the sum of potential energies for this branch cycle traversal is 0+1+0−1−1+0+1+1+0−1−1+1=0, which satisfies the branch cycle traversal condition.

The DSTZ graph may be used to generate a switching sequence starting from a reference node in the plurality of nodes in response to an input sequence. This may be performed in order to satisfy the two conditions of the number conservation rule (2a) and (2b) in an efficient manner. Since the DSTZ graph is created to force the total work function or the total potential energy to zero for a cycle traversal, the switching sequence has a sum bounded by a finite number.

Figure 4:
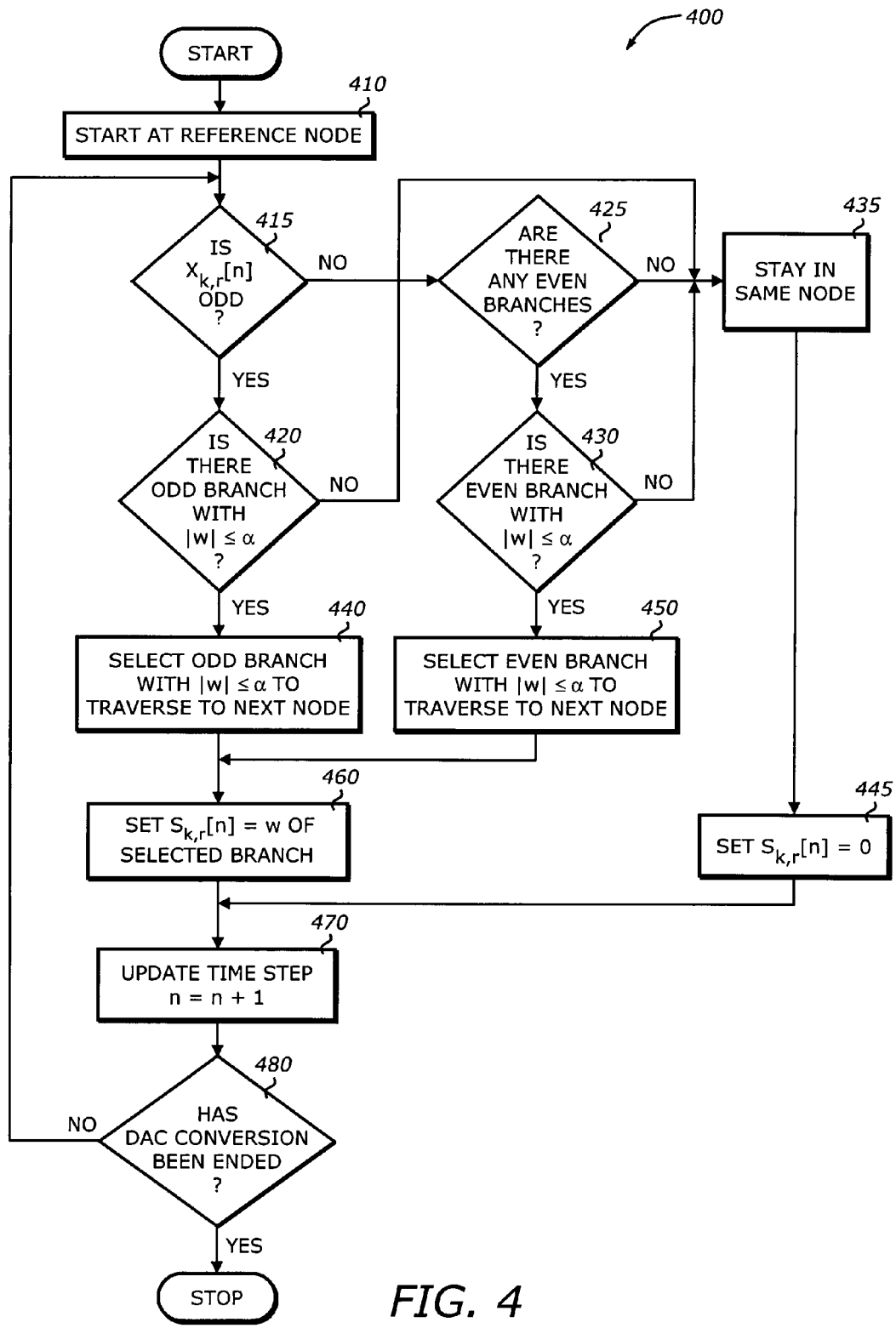
FIG. 4 is a flowchart illustrating a process to generate a switching sequence using the DSTZ graph according to one embodiment of the invention.

FIG. 4 is a flowchart illustrating a process 400 to generate a switching sequence using the DSTZ graph according to one embodiment of the invention.

Upon START, the process 400 starts at a reference node as the current node (Block 410). A reference node is any node that has a zero potential energy. Then, at time step n, the process 400 determines if the input $x_{k,r}[n]$ is odd where the $x_{k,r}[n]$ is an input in the input sequence (Block 415). If not, the process 400 determines if there are any even branches from the current node (Block 425).

If the input $x_{k,r}[n]$ is odd, the process 400 determines if there is an odd branch with an absolute value of the associated work function (|w|) less than or equal to $\alpha=\min\{x_{k,r}[n], 2^k-x_{k,r}[n]\}$ (Block 420). If so, the process 400 selects an odd branch node $|w|\leq\alpha$ to traverse to the next node and sets the next node as the current node (Block 440), and proceeds to block 460. Otherwise, the process 400 goes to block 435. If the input $x_{k,r}[n]$ is even, the process 400 determines if there is an even branch with an absolute value of the associated work function |w| less than or equal to $\alpha=\min\{x_{k,r}[n], 2^k-x_{k,r}[n]\}$ (Block 430). If so, the process 400 selects an even branch with $|w|\leq\alpha$ to traverse to the next node and sets the next node as the current node (Block 450), and proceeds to block 460. Otherwise, the process 400 goes to Block 435. In another embodiment, the requirement $|w|\leq\alpha$ may be removed in blocks 440 and 450; and blocks 420 and 430 may be skipped.

If the input $x_{k,r}[n]$ is even and there are no even branches originating from the current node, the process 400 stays in the same node (Block 435). Then, the process 400 sets the output of the switching sequence to be $s_{k,r}[n]=0$ (Block 445) and then proceeds to Block 470.

In Block 460, the process 400 sets the output of the switching sequence to be $s_{k,r}[n]$=work function w of the selected branch (Block 460). Next, the process 400 updates the time step n=n+1 to process the next input (Block 470). Then, the process 400 determines if the DAC conversion has been ended (Block 480). The DAC conversion may be ended by the user by powering it down. If not, the process 400 returns to Block 415 to continue to process the next input at the next time step. Otherwise, the process 400 is terminated.

As an illustration, the process 400 is applied to the DSTZ graph 300 shown in FIG. 3. The DSTZ graph 300 has four nodes that have zero potential energy. Any one of these four nodes may be selected as a reference node. Suppose node G 322 is selected as the reference node. Suppose the input sequence $x_{k,r}[n]$ is $\{0,1,0,1,0,1,0,1\}$. At time step n=0, $x_{k,r}[0]$ is even. Node G 322 does not have any even branch originating from it. Therefore, the process 400 stays in node G 322 and sets $s_{k,r}[0]=0$. At time step n=1, the input $x_{k,r}[1]$ is odd. There are two odd branches coming from node G 322: branch (k) 360 and branch (l) 362. The absolute values of the work functions of both branches are 1 which is less than or equal to min $\{1, 2^k-x_{k,r}[1]\}=1$. The process 400 may select randomly. Assume branch (k) 360 is selected. The process 400 transitions to node H 324 and sets $s_{k,r}[1]$ equal to 1. In the similar manner, the switching sequence is obtained as $s_{k,r}[n]=\{0,1,0,-1,0,-1,0,1\}$.

An interesting property of this switching sequence is that its double sum is equal to zero:

$$\sum_{m=0}^{N-1}\sum_{n=0}^{m} s_{k,r}[n] = (0) + (0+1) + (0+1+0) + (0+1+0-1) + (0+1+0-1+0) + \\ (0+1+0-1+0-1) + (0+1+0-1+0-1+0) + \\ (0+1+0-1+0-1+0+1) = 0+1+1+0+0-1-1+0 = 0$$

Experience shows that any sequence generated by such method on a cycle traversal will also have its double sum equal to zero. A sequence which has its double sum bounded by a finite number is also a $2^{nd}$-order-shaped sequence, specifically, having a $(1-z^{-1})^2$ characteristics in the power spectrum.

Assuming the parity of $x_{k,r}[n]$ is random enough, since there is only a finite number of nodes in the graph, the probability of any traversal returning to the reference node within a finite time is exactly 1. It follows that any long enough sequence may have most of its length (except a finite tail) consisting of concatenations of cycle traversals starting and ending at the reference node. The double sum of the generated switching sequence may then be bounded and hence $2^{nd}$ order shaped.

From the DSTZ graph and the sequencing of the process 400, circuit implementation for the FSM is straightforward. The resulting circuit does not require any of the accumulators, quantizer, or limiter as in prior art techniques, resulting in a more economical and efficient design.

Another advantage is that whenever there is more than one odd (or even) branch originating from a node (e.g., node G in FIG. 3), the process 400 may choose any of the odd (or even) branches to traverse. Such freedom provides a good case for dithering. Randomness (e.g., a random number generator) may be employed to decide which branch to choose. Such operation may introduce unpredictability to the circuit, alleviating the tonal behavior at the output.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   creating a double-summed-to-zero (DSTZ) graph having a plurality of nodes linked by a plurality of directed branches, the DSTZ graph representing a finite state machine (FSM) that generates a sequence for a switching block used in a mismatch-shaping digital-to-analog converter (DAC), each of the plurality of nodes representing a state in the FSM, the DSTZ graph having a total work function and a total potential energy summing to zero for a cycle traversal; and
   generating a switching sequence starting from a reference node in the plurality of nodes in response to an input sequence, the reference node having a zero potential energy.

2. The method of claim 1 wherein creating the DSTZ graph comprises:
  associating a potential energy to each of the plurality of nodes;
  associating a work function to each of the plurality of branches, the work function being equal to a potential energy difference between a terminating node and an originating node;
  creating at least two branches including an even branch and an odd branch from a node having non-zero potential energy, the even branch and the odd branch having an even work function and an odd work function, respectively; and
  creating at least an odd branch originating from a zero potential energy node.

3. The method of claim 1 wherein the total work function sum is a sum of the work functions associated with branches traversed in the cycle traversal and the total potential energy is a sum of the potential energies associated with the nodes traversed in the cycle traversal.

4. The method of claim 2 wherein generating the switching sequence comprises:
  selecting an odd or even branch to traverse to a next node if an absolute value of the associated work function is less than or equal to min $\{x_{k,r[n]}, 2^k - x_{k,r[n]}\}$ where $x_{k,r[n]}$ is an input in the input sequence unless there is no such branch, respectively;
  staying in same node if there is no such branch; and
  setting an output of the switching sequence to be equal to work function of the selected odd or even branch or to be equal to zero if there is no such branch.

5. The method of claim 4 wherein selecting an odd or even branch comprises:
  selecting randomly the odd or even branch if there are more than one such branch.

6. The method of claim 1 wherein the cycle traversal includes a cycle branch traversal originating from and terminating at same node, counting as many times as a branch is traversed and a cycle node traversal originating from and terminating at same branch, counting as many times as a node is traversed, the cycle branch traversal and the cycle node traversal corresponding to the zero work function sum and the zero potential energy sum, respectively.

7. The method of claim 2 wherein the potential energy is an integer.

8. A finite state machine (FSM) comprising:
  a plurality of states represented by a plurality of nodes linked by a plurality of directed branches, each of the plurality of nodes being associated with a potential energy, each of the directed branches being associated with a work function; the work function being equal to a potential energy difference between a terminating node and an originating node; wherein a total work function and a total potential energy summing to zero for a cycle traversal and the plurality of states generating a switching sequence starting from a reference node in the plurality of nodes in response to an input sequence, the reference node having a zero potential energy.

9. The FSM of claim 8 wherein there are at least two branches including an even branch and an odd branch from a node having non-zero potential energy, the even branch and the odd branch having an even work function and an odd work function, respectively; and there is at least an odd branch originating from a zero potential energy node.

10. The FSM of claim 8 wherein the total work function sum is a sum of the work functions associated with branches traversed in the cycle traversal and the total potential energy sum is a sum of the potential energies associated with the nodes traversed in the cycle traversal.

11. The FSM of claim 9 wherein a state transition is such that a state in the plurality of states transitions on an odd or even branch to traverse to a next state if an absolute value of the associated work function is less than or equal to min $\{x_{k,r[n]}, 2^k - x_{k,r[n]}\}$ where $x_{k,r[n]}$ is an input in the input sequence unless there is no such branch, respectively; or a state in the plurality of states stays same if there is no such branch; and wherein an output of the switching sequence is set to be equal to work function of the transitioned odd or even branch or to be equal to zero if there is no such branch.

12. The FSM of claim 11 wherein the state transition is such that a state in the plurality of states transitions randomly on the odd or even branch if there are more than one such branch.

13. The FSM of claim 8 wherein the cycle traversal includes a cycle branch traversal originating from and terminating at same node, counting as many times as a branch is traversed and a cycle node traversal originating from and terminating at same branch, counting as many times as a node is traversed, the cycle branch traversal and the cycle node traversal corresponding to the zero work function sum and the zero potential energy sum, respectively.

14. The FSM of claim 8 wherein the potential energy is an integer.

15. A digital-to-analog converter (DAC) comprising:
  a plurality of DAC elements; and
  a digital encoder coupled to the plurality of the DAC elements to select the DAC elements, the digital encoder having a plurality of switching blocks, each of the switching blocks being implemented by a finite state machine (FSM), the FSM comprising:
    a plurality of states represented by a plurality of nodes linked by a plurality of directed branches, each of the plurality of nodes being associated with a potential energy, each of the directed branches being associated with a work function; the work function being equal to a potential energy difference between a terminating node and an originating node; wherein a total work function and a total potential energy summing to zero for a cycle traversal and the plurality of states generating a switching sequence starting from a reference node in the plurality of nodes in response to an input sequence, the reference node having a zero potential energy.

16. The DAC of claim 15 wherein there are at least two branches including an even branch and an odd branch from a node having non-zero potential energy, the even branch and the odd branch having an even work function and an odd work function, respectively; and there is at least an odd branch originating from a zero potential energy node.

17. The DAC of claim 15 wherein the total work function sum is a sum of the work functions associated with branches traversed in the cycle traversal and the total potential energy sum is a sum of the potential energies associated with the nodes traversed in the cycle traversal.

18. The DAC of claim 16 wherein a state transition is such that a state in the plurality of states transitions on an odd or even branch to traverse to a next state if an absolute value of the associated work function is less than or equal to min $\{x_{k,r[n]}, 2^k - x_{k,r[n]}\}$ where $x_{k,r}[n]$ is an input in the input sequence unless there is no such branch, respectively; or a state in the plurality of states stays same if there is no such branch; and wherein an output of the switching sequence is set to be equal to work function of the transitioned odd or even branch or to be equal to zero if there is no such branch.

19. The DAC of claim 18 wherein the state transition is such that a state in the plurality of states transitions randomly on the odd or even branch if there are more than one such branch.

20. The DAC of claim 17 wherein the cycle traversal includes a cycle branch traversal originating from and terminating at same node, counting as many times as a branch is traversed and a cycle node traversal originating from and terminating at same branch, counting as many times as a node is traversed, the cycle branch traversal and the cycle node traversal corresponding to the zero work function sum and the zero potential energy sum, respectively.

21. The DAC of claim 15 wherein the potential energy is an integer.

* * * * *